United States Patent [19]

Liu et al.

[11] 4,178,674

[45] Dec. 18, 1979

[54] PROCESS FOR FORMING A CONTACT REGION BETWEEN LAYERS OF POLYSILICON WITH AN INTEGRAL POLYSILICON RESISTOR

[75] Inventors: Sheau-Ming S. Liu, Sunnyvale; William H. Owen, III, Mountain View; Richard D. Pashley, Sunnyvale, all of Calif.

[73] Assignee: Intel Corporation, Santa Clara, Calif.

[21] Appl. No.: 890,139

[22] Filed: Mar. 27, 1978

[51] Int. Cl.$^2$ .............................................. B01J 17/00
[52] U.S. Cl. .................................. 29/571; 29/577 C; 357/59; 29/576 C
[58] Field of Search ................. 29/577, 578, 576 OC, 29/571; 357/59

[56] References Cited

U.S. PATENT DOCUMENTS

| | | | |
|---|---|---|---|
| 3,570,114 | 3/1971 | Bean | 29/577 |
| 4,016,587 | 4/1977 | De La Moueda | 357/59 |
| 4,085,498 | 4/1978 | Rideout | 357/59 |

Primary Examiner—W. C. Tupman
Attorney, Agent, or Firm—Blakely, Sokoloff, Taylor & Zafman

[57] ABSTRACT

A process for forming an electrical contact region between layers of polysilicon with an integral polysilicon resistor during the fabrication of MOS integrated circuits is disclosed. The contact region which does not require critical alignments, may be formed directly over an active channel or buried (substrate) contact. A silicon nitride mask is formed at the location of the contact region on the first polysilicon layer thereby allowing a thick oxide to be grown on the remainder of the substrate. After removal of the silicon nitride mask, a second polysilicon layer is formed which contacts the first layer at the contact region and defines the resistor. A doping step is used to establish the resistance of the resistor. The process permits the fabrication, by way of example, of a static (bistable) MOS memory cell employing polysilicon loads with an area of approximately 1.5 mils$^2$.

6 Claims, 14 Drawing Figures

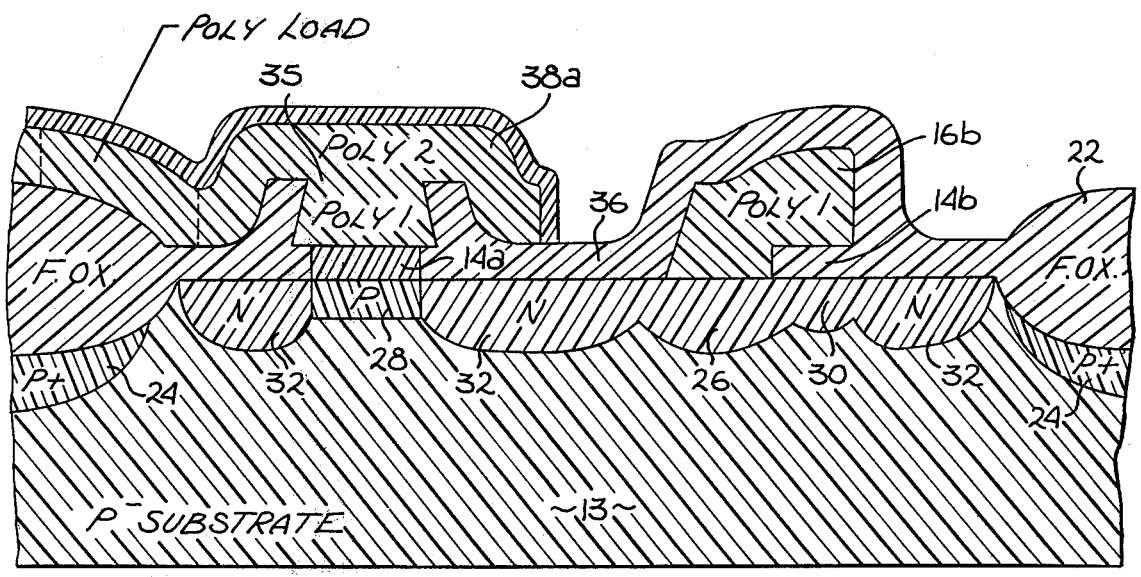
Fig. 9
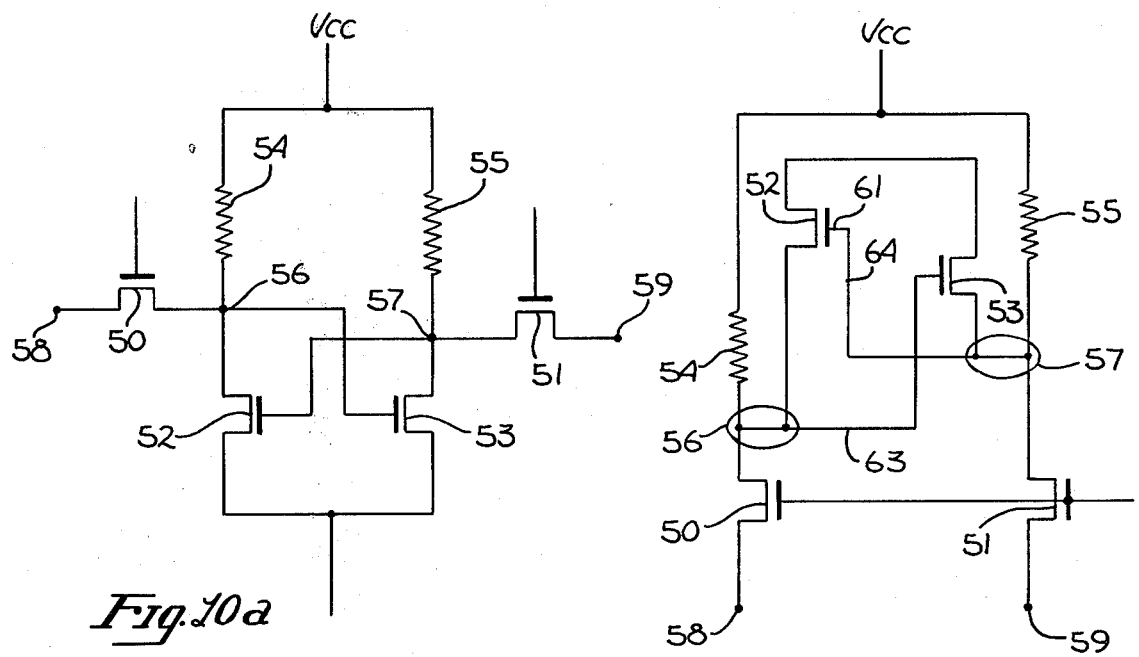
Fig. 10a
Fig. 10b

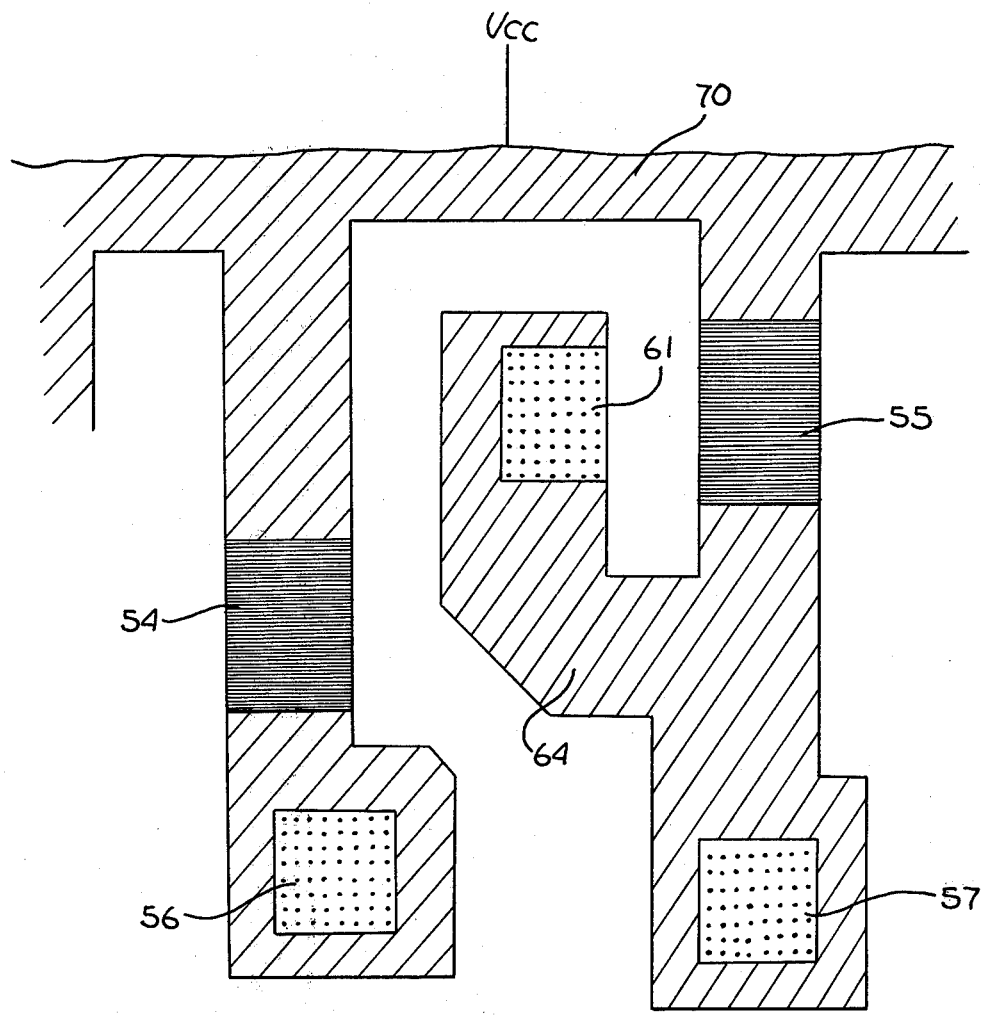
Fig. 12 (POLY 2)

PROCESS FOR FORMING A CONTACT REGION BETWEEN LAYERS OF POLYSILICON WITH AN INTEGRAL POLYSILICON RESISTOR

BACKGROUND OF THE INVENTION

1. Field of the Invention

The invention relates to the field of electrical contacts particularly contacts between intermediate layers in an integrated circuit.

2. Prior Art

Numerous processes and structures are known for providing electrical contacts in integrated circuits between layers or between a layer and the substrate. For example, metal contacts have long been used to connect the lines and pads of an overlying metal layer with regions in the substrate such as source and drain regions. "Buried" contacts are frequently used to connect a first layer of metal or polycrystalline silicon (polysilicon) with a substrate region. Examples of such contacts are shown in U.S. Pat. Nos. 3,586,922 and 4,033,026. Processes for interconnecting intermediate metal layers are also known such as shown in U.S. Pat. No. 3,700,508. Contacts between layers through vias are discussed in "Evolution and Current Status of Aluminum Metallization" by Arthur J. Learn, *Journal of the Electrochemical Society*, Vol. 123, No. 6, June 1976.

Recently, more use has been made of double layers of polysilicon since the use of such layers has enabled an increase in circuit density. For example, double layers of polysilicon are used to form memory cells where the first layer defines floating gates and the upper layer, control gates. (See U.S. Pat. No. 3,996,657). In some instances, it is desirable to provide interconnections between members formed from these layers. The invented process provides contact regions between layers of polysilicon which are insulated from one another. Contact regions are formed by actual contact between the first and second layers of polysilicon. Thus, the contact regions are formed without requiring separate contact members, such as metal members. Moreover, with the invented process, contacts may be formed over buried contacts or directly over active channel regions. The contact regions of the present invention are self-aligning, thus no critical alignments are required.

SUMMARY OF THE INVENTION

A process for forming a contact region between layers of polysilicon with an integral polysilicon resistor is described. After a first layer of polysilicon is formed, a region is defined on this first layer at the site of the proposed contact region with a silicon nitride member. Then an oxide layer is grown on the substrate with the silicon nitride member in place. Because of the silicon nitride member, growth of the oxide under this member is prevented. After the silicon nitride member is removed, a second layer of polysilicon is formed over the first layer of polysilicon. A polysilicon resistor is formed from this layer; the resistance of this resistor is adjusted by a doping step. In this manner, a contact region is formed between the first and second layers of polysilicon at the location of the silicon nitride member with an integral polysilicon resistor.

BRIEF DESCRIPTION OF THE DRAWINGS

FIG. 9 illustrates the substrate of FIG. 8 after a subsequent masking and etching step used to define this second layer of polysilicon.

FIG. 10a is an electrical schematic of a well-known static memory cell.

FIG. 10b is an electrical schematic of the cell of FIG. 10a with the cell redrawn.

FIG. 12 is a plan view of the second layer of polysilicon used in the memory cell of FIG. 11.

DETAILED DESCRIPTION OF THE INVENTION

A process is described for forming a contact region between layers of polysilicon or between members formed from the layers with an integral polysilicon resistor. A bistable memory cell which employs these contact regions is also described. In the following description, numerous specific details such as specific conductivity types and dimensions are set forth in order to provide a thorough understanding of the invented process. However, it will be obvious to one skilled in the art that the described invention may be practiced without these specific details. In other instances, well-known processing steps have not been described in detail in order not to obscure the present invention in unnecessary detail.

Figure 1:
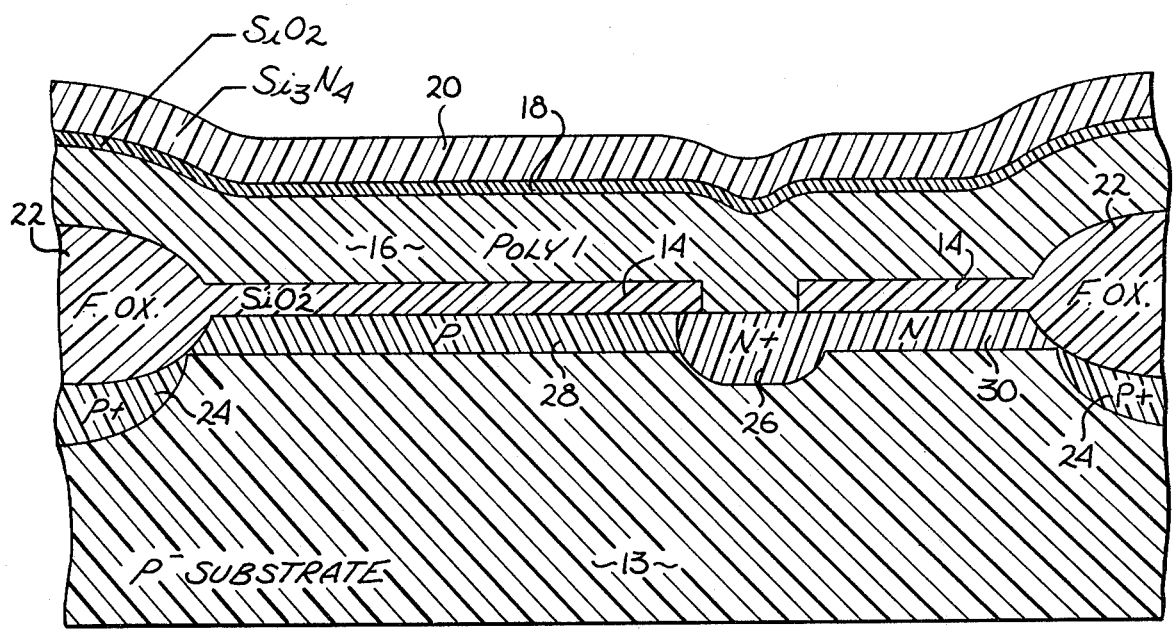
FIG. 1 is a cross-sectional elevation view of a silicon substrate with numerous layers formed on the surface of the substrate.

Referring first to FIG. 1, the lightly doped p-type silicon substrate 13 is shown after a number of "front-end" processing steps. The substrate 13 includes field oxide regions 22 which are approximately 12,000 Å thick. Channel stops 24 are formed below these field oxide regions in a well-known manner. The surface of the substrate 13 includes a p-type region 28, a buried contact n+-type region 26 and a n-type region 30. The regions 28 and 30 are threshhold voltage adjusting regions for field-effect transistors. An enhancement mode transistor is fabricated generally at region 28 and a depletion mode transistor is fabricated generally at region 30. The process employed, in the presently preferred embodiment, for forming the regions 28 and 30 is described in U.S. Pat. No. 4,052,229.

A gate oxide layer 14 is grown on the substrate 13; in the presently preferred process, this silicon dioxide layer is approximately 700 Å thick. A portion of this layer is removed at the region 26 since a buried contact is formed at this location. A first polysilicon layer 16 is formed on the silicon dioxide layer 14 and in contact with the substrate 13 at the region 26. This polysilicon layer for the described embodiment, is approximately 6,000 Å thick. A second oxide layer 18 is grown on the first polysilicon layer 16 to a thickness of approximately 600 Å. This layer is employed primarily to protect the polysilicon layer 16 during the plasma etching of the overlying silicon nitride masking layer 20. The silicon nitride layer 20 is approximately 1000 Å in the presently preferred process. (The relative thicknesses of the layers on substrate 13 are not shown to scale in the drawings. The relative thicknesses shown in the drawings have been selected so as to best illustrate the invented process).

Figure 2:
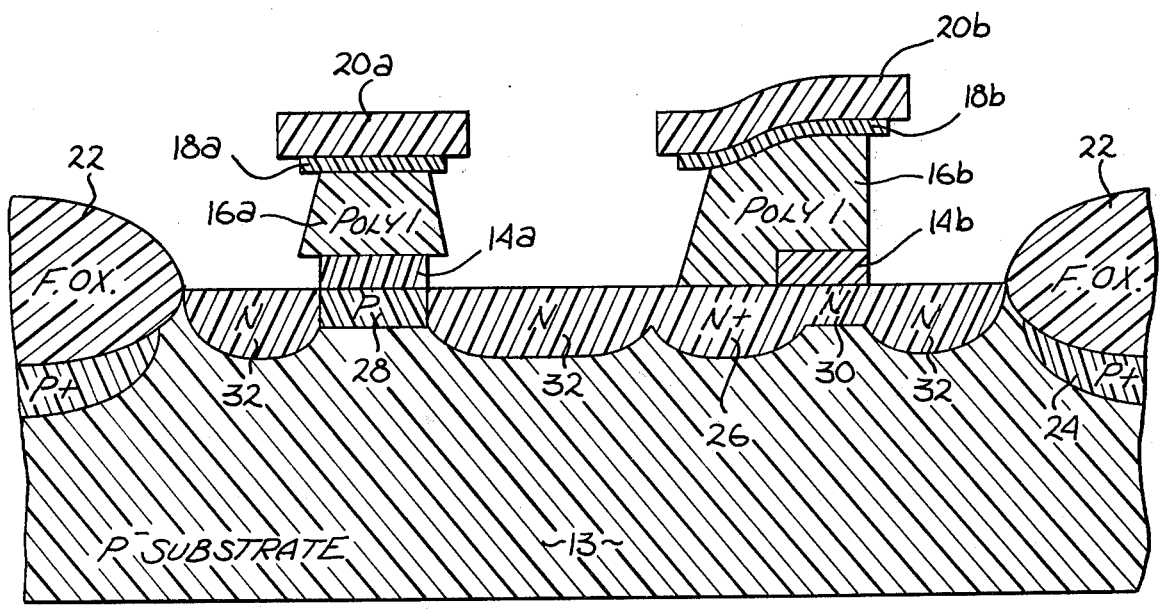
FIG. 2 illustrates the substrate of FIG. 1 after a masking step and several etching steps used to define members from a first layer of polysilicon.

A photoresist mask is formed on the silicon nitride layer 20 to define the silicon nitride members 20a and 20b shown in FIG. 2. These members are formed at the desired locations of gates, lines or other members which are formed from the first layer of polysilicon. In the presently preferred process, plasma etching is used to define these members. Then three additional etching steps are employed to etch the oxide layer 18, the polysilicon layer 16 and finally the gate oxide layer 14 as shown in FIG. 2. An arsenic implant followed by a drive-in cycle is used to form the source and drain regions 32 also shown in FIG. 2. A thin oxide layer 34 is grown on the substrate to seal-off the exposed polysilicon edges and source and drain regions.

The member 16a is a gate for an enhancement mode transistor which includes the active channel region 28 and the source and drain regions 32. The member 16b is the gate for a depletion mode transistor which includes the active channel region 30. The member 16b also defines a contact which contacts the region 26.

In the following description, a second layer of polysilicon is formed on the substrate 13 and a contact region is formed between the first layer and second layer directly above the channel region 28. No contact is formed between this second polysilicon layer and the member 16b.

Figure 3:
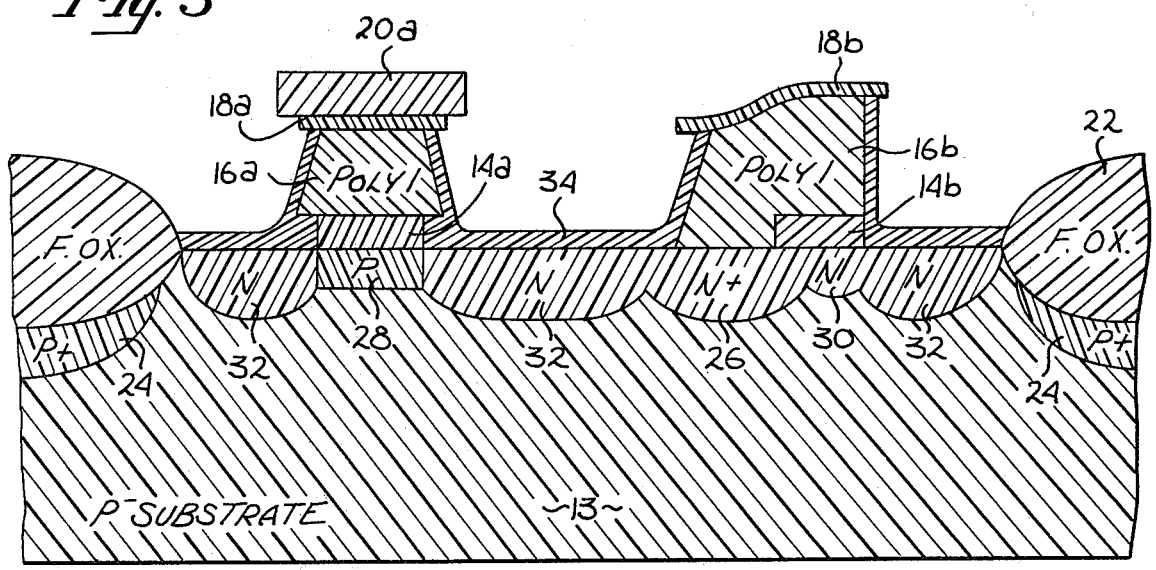
FIG. 3 illustrates the substrate of FIG. 2 after subsequent masking, etching and doping steps.
Figure 4A:
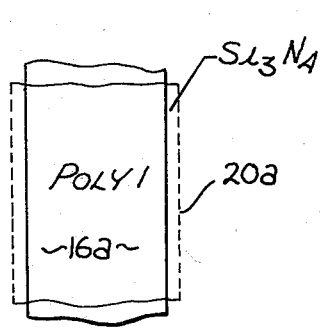
FIG. 4a is a plan view of a portion of the substrate of FIG. 2.
Figure 4B:
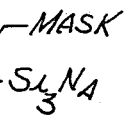
FIG. 4b illustrates the portion of the substrate of FIG. 4a after a masking and etching step.

Since a contact region is formed over the member 16a a photoresist mask is defined on the silicon nitride member 20a at the desired location of the contact region. Referring to FIG. 4a, assume that the polysilicon member 16a is an elongated line of polysilicon. The silicon nitride member 20a is shown overlying this elongated strip. In FIG. 4b, the masking member used to remove the silicon nitride from the substrate, except at the contact region, is shown. Note that there is no criticality in the alignment of this mask. There is no requirement for the member 20a to be aligned with any underlying region. After the photoresist mask for defining the contact region has been formed, the silicon nitride is etched as shown in FIG. 3 with a plasma etching step. This results in the removal of the silicon nitride above the member 16b since no contact is formed above this member.

Figure 5:
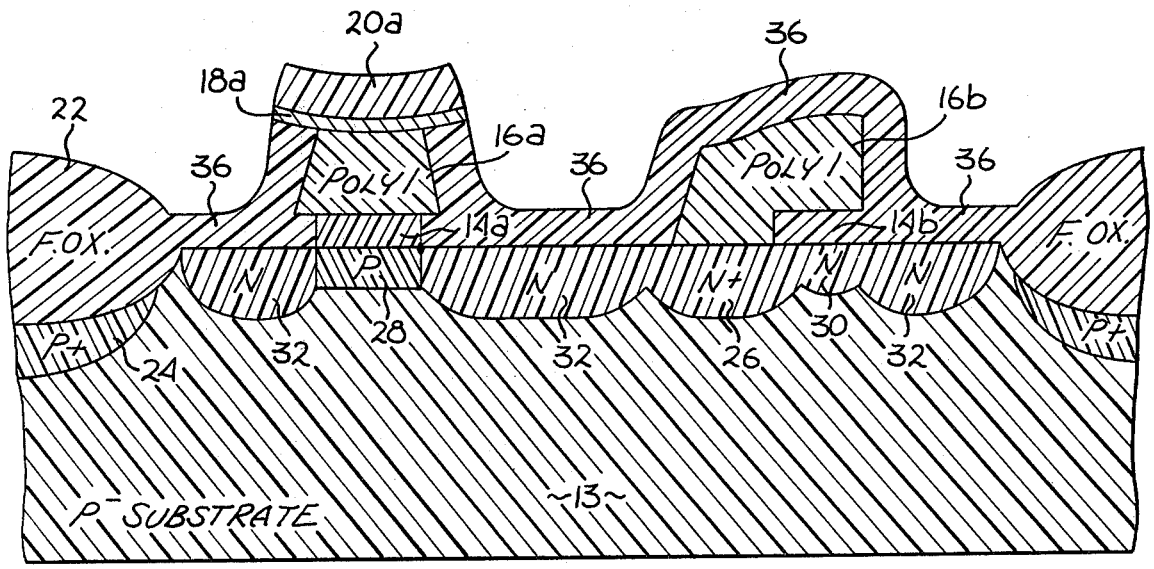
FIG. 5 illustrates the substrate of FIG. 3 after an oxide layer has been grown on the substrate.

Next as shown in FIG. 5, a relatively thick oxide layer 36 is grown on the substrate to a thickness of approximately 3000 Å. Note that because of the silicon nitride member 20a, the oxide growth below this member is greatly retarded, thus very little oxide develops on the members 16a.

Figure 6:
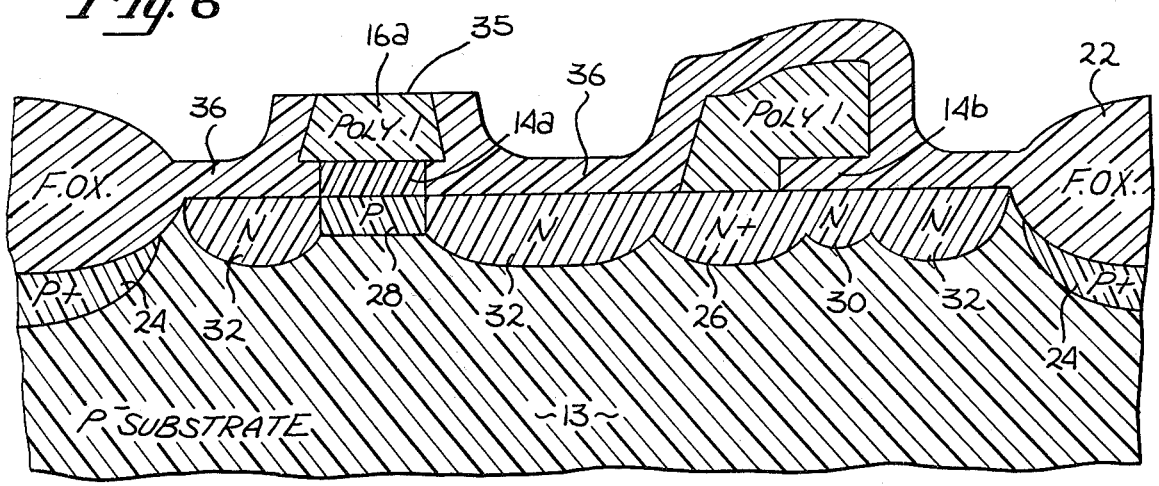
FIG. 6 illustrates the substrate of FIG. 5 after two etching steps, one of which is used to remove oxide at the contact region.
Figure 7:
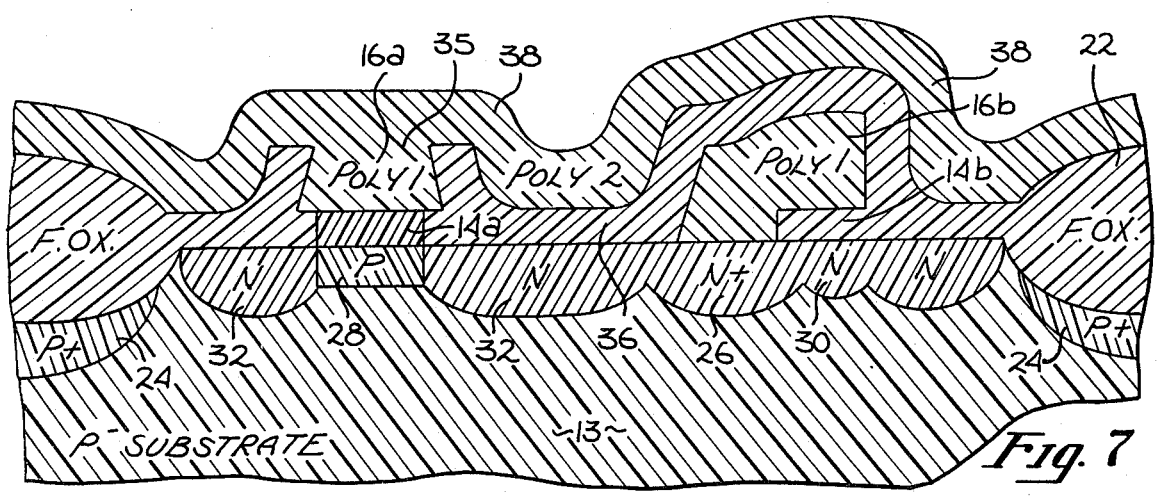
FIG. 7 illustrates the substrate of FIG. 6 after a second layer of polysilicon has been formed on the substrate.

Following the growth of the oxide layer 36, the silicon nitride member 28 is removed (by etching) and a relatively light hydrofluoric dip is used to remove the oxide from the upper surface of member 16a. This dip does not remove the layer 36 since that layer is substantially thicker than the oxide on member 16a. Now as may be seen in FIG. 6, the upper surface 35 of the member 16a is exposed while the remainder of the substrate is covered with an oxide layer. At this point, as shown in FIG. 7, a second layer 38 of polysilicon which is approximately 5500 Å thick is formed on the substrate. This layer is in contact with the members 16a at surface 35, and thus a contact region is formed at the interface of these two polysilicon layers.

In the above description, a contact region was formed at the member 16a since the silicon nitride member was left in place when the oxide layer 36 was grown. If it were necessary to form a contact region at the member 16b (or elsewhere), the silicon nitride member would have been left in place on member 16b (or other member or line) when the layer 36 was grown. Thus with the described process, the contact region may also be formed above a buried contact or any other member including lines.

In the presently preferred process, after the second layer of polysilicon is formed, this polysilicon layer is subject to an arsenic implant (shown by lines 40 in FIG. 7). This implant is used to adjust the resistivity of the polysilicon in this layer to a predetermined level. For the described embodiment, the resistivity is relatively high since portions of this layer are used as load resistors in a memory cell.

Figure 8:
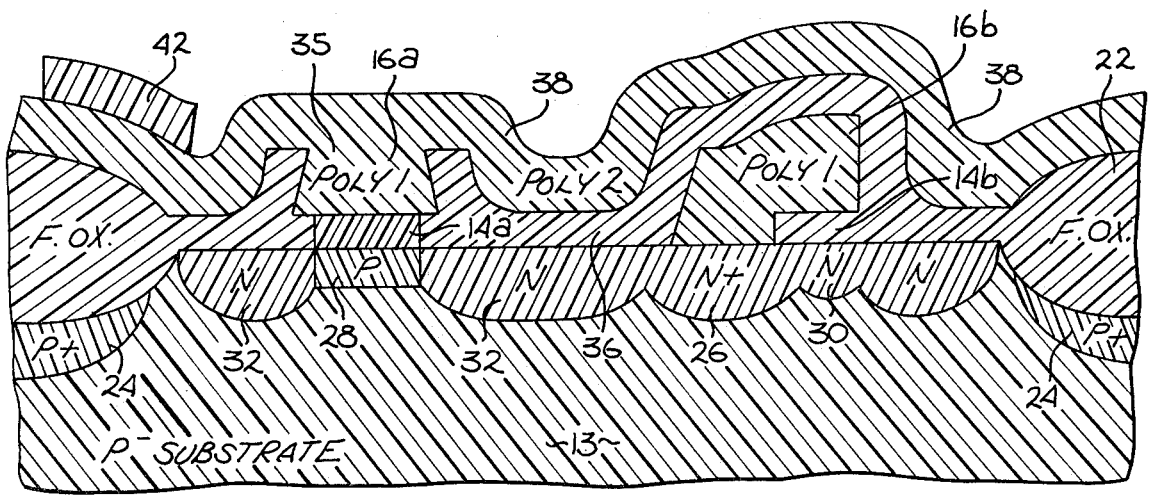
FIG. 8 illustrates the substrate of FIG. 7 with a masking member formed on the second layer of polysilicon used to define a polysilicon resistor.

Next, a masking member 42 is formed on the second layer 38 of polysilicon at the desired location of a polysilicon resistor. The second layer of polysilicon is then subjected to a second arsenic implant to lower its resistance (except under member 42) making it suitable for low resistance interconnections. This second implantation is shown in FIG. 8 by the lines 44.

Now the second layer of polysilicon may be masked and etched to form interconnecting lines, gates, resistors or other structures. In FIG. 9, the layer 38 is shown etched to form a line 38 which contacts the gate member 16a at surface 35 and which includes an integral polysilicon resistor 46. Well-known processing steps may now be employed to complete the devices of FIG. 9.

In the above described process, a contact region was formed at surface 35 between a first and a second layer of polysilicon. It will be obvious that the process may be employed to provide a contact region between a second and third layer, or between other layers.

The above described contact region may be employed to form high density static memory cells which include polysilicon loads such as resistor 46 of FIG. 9. In FIG. 10a, a well-known bistable circuit which includes load resistors 54 and 55 coupled in series with transistors 52 and 53, respectively, is shown. Node 56 is coupled to the gate of transistor 53, while node 57 is coupled to the gate of transistor 52. Transistors 50 and 51 allow the cell of FIG. 10a to be selected such that its state may be sensed or altered at terminals 58 and 59.

The memory cell of FIG. 10a has been redrawn in FIG. 10b. An examination of the circuits of FIGS. 10a and 10b will reveal that they are identical except for their arrangement. The components of the cell are approximately arranged in FIG. 10b as they are "laid out" in the plan view of FIG. 11. This has been done to assist in understanding the integrated circuit layout of FIG. 11. The static memory cell of FIG. 11 employs the invented contact regions described above at nodes 56, 57 and 61. Also, the cell uses the polysilicon resistor loads shown in FIGS. 8 and 9 above for resistors 54 and 55. The memory cell of FIG. 11, when fabricated with n-channel, field-effect transistors employing silicon gates, requires an area of approximately 1.5 mils$^2$.

The nodes 56 and 57 employ contact regions as described above which regions are formed in conjunction with buried contacts. At node 61, a contact region is used to interconnect the line 64 which line is formed from the second layer of polysilicon with the gate of transistor 52, which gate is formed from the first layer of polysilicon. This contact region is not formed over the active channel of transistor 51, but rather off to the side of the channel as may be seen in FIG. 11. Also the contact regions at nodes 56 and 57 are not formed over the active channel for the cell layout of FIG. 11. However, as described above, the contact regions may be formed directly over active regions.

Figure 11:
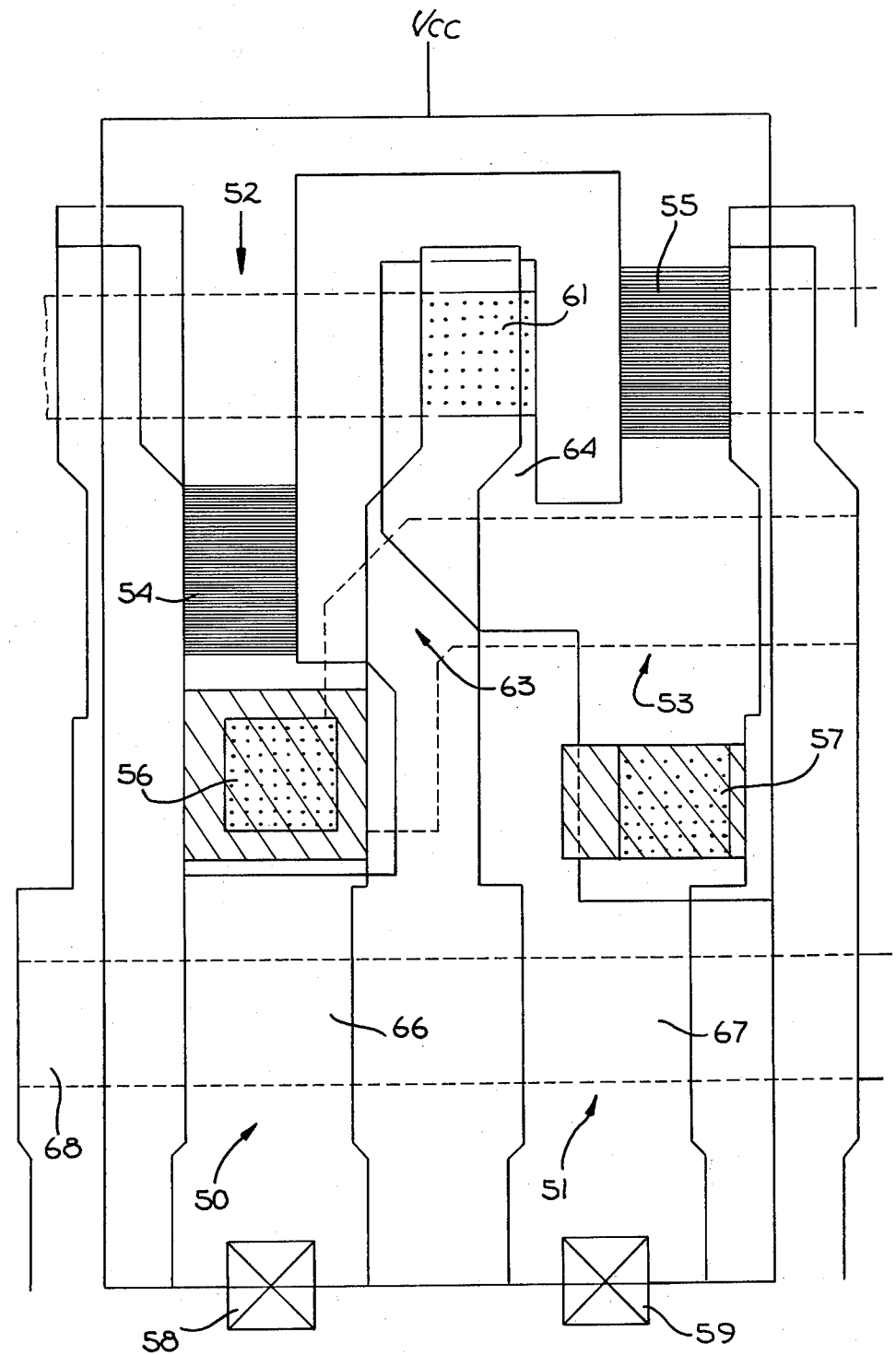
FIG. 11 is a plan view of the cell of FIG. 10b which illustrates the layout of the cell in an integrated circuit employing the invented contact regions.

In FIG. 11, the contacts 58 and 59 are shown (at the lower portion of the drawing; these contacts provide access to the transistors 50 and 51, respectively. These transistors include the active channel regions 66 and 67, respectively. The gates of transistors 50 and 51 are formed from a common, elongated polysilicon line 68 which is etched from the first layer of polysilicon.

In FIG. 11, contact regions between the layers of polysilicon are shown by the dotted areas with the underlying buried contacts as the lined areas. The line 63 interconnecting node 56 with the gate of transistor 53 is shown as a dotted line. This line is formed from the first level of polysilicon and defines the gate of transistor 53. The line 64 which interconnects node 57 with the contact region at node 61 is formed from the second level of polysilicon as is best shown in FIG. 12. Line 64 is electrically coupled by this contact region to a line formed from the first level of polysilicon which defines the gate of transistor 52 as is shown in FIG. 11.

Referring to FIG. 12, the lines formed from the second level of polysilicon are shown in this figure to assist in understanding the layout of FIG. 11. The horizontal line 70 receives the $V_{cc}$ potential and is coupled to the loads 54 and 55. These high resistance portions of the polysilicon lines are formed in the manner described for resistor 46 (FIGS. 6-9). The resistor 54 is coupled at node 56 to the first level of polysilicon and also to the substrate. Similarly, the resistor 55 is coupled to the first level of polysilicon at node 57 and also to the underlying substrate. The node 61, as mentioned, is coupled to line 64.

It should be noted that with the use of the described contact regions and the layout of the memory cell shown in FIG. 11, a substantial area reduction is possible when compared to prior art static cells.

Thus, a process for forming an electrical contact region between layers of polysilicon has been described. The contact region may be formed directly over active channel regions or over buried contacts; these contact regions may be formed without critical masking alignments. By way of example, the use of such contact regions permits a reduction of the cell area in a static memory cell when compared to prior art cells.

We claim:

1. In the processing of an MOS integrated circuit on a silicon substrate which circuit includes first and second polysilicon layers, an improved process for providing a polysilicon resistor formed from said second polysilicon layer in contact with a selected member formed from said first polysilicon layer, comprising the steps of:

forming said first polysilicon layer;

forming a silicon nitride layer overlying said first polysilicon layer;

defining a plurality of patterns in said silicon nitride layer;

etching a plurality of members in said first polysilicon layer corresponding to said patterns;

selectively removing said patterns, leaving in place at least a portion of one of said patterns over said selected member;

growing an oxide layer on said substrate;

removing from said selected member the remaining pattern formed from said silicon nitride layer;

forming said second polysilicon layer;

doping said second polysilicon layer to obtain a predetermined resistivity;

forming a mask over a portion of said second polysilicon layer, said portion corresponding to said polysilicon resistor;

again doping said second polysilicon layer such that the doping level under said mask is substantially unchanged;

forming at least one line from said second polysilicon layer which includes said portion of said second polysilicon layer corresponding to said polysilicon resistor and which overlies said selected member;

whereby a polysilicon resistor formed from said second polysilicon layer contacts said selected member formed from said first polysilicon layer.

2. The process defined by claim 1 wherein said selected member is a gate member of a field-effect transistor.

3. The process defined by claim 2 wherein said doping steps comprise ion implantations.

4. The process defined by claim 2 wherein a protective oxide layer is formed on said first polysilicon layer prior to the formation of said silicon nitride layer.

5. The process defined by claim 4 including an etching step to remove said protective oxide layer after said removal from said selected member, said remaining pattern formed from said silicon nitride layer.

6. The process defined by claim 2 including the formation of a gate oxide layer on said substrate prior to said forming of said first polysilicon layer.

* * * * *